United States Patent
Stocks et al.

[19]

[11] Patent Number: 5,882,535
[45] Date of Patent: Mar. 16, 1999

[54] METHOD FOR FORMING A HOLE IN A SEMICONDUCTOR DEVICE

[75] Inventors: Richard L. Stocks; Kevin G Donohoe, both of Boise, Id.

[73] Assignee: Micron Technology, Inc., Boise, Id.

[21] Appl. No.: 794,355

[22] Filed: Feb. 4, 1997

[51] Int. Cl.⁶ .................................................. H01L 21/00
[52] U.S. Cl. ................................ 216/18; 216/39; 216/67; 438/695; 438/696; 438/710
[58] Field of Search .................... 216/18, 39, 67; 438/695, 696, 710

[56] References Cited

U.S. PATENT DOCUMENTS

| | | | |
|---|---|---|---|
| 4,256,514 | 3/1981 | Pogge | 148/1.5 |
| 4,376,672 | 3/1983 | Wang et al. | 156/643 |
| 4,436,584 | 3/1984 | Bernacki et al. | 156/643 |
| 4,657,628 | 4/1987 | Holloway et al. | 156/643 |
| 4,734,157 | 3/1988 | Carbaugh et al. | 156/643 |
| 4,855,015 | 8/1989 | Douglas | 156/626 |
| 4,946,550 | 8/1990 | Van Learhoven | 156/306 |
| 4,986,877 | 1/1991 | Tachi et al. | 156/643 |
| 4,994,715 | 2/1991 | Asmus et al. | 315/111.71 |
| 5,010,032 | 4/1991 | Tang et al. | 437/57 |
| 5,202,291 | 4/1993 | Charvat et al. | 437/245 |
| 5,217,570 | 6/1993 | Kadomura | 156/665 |
| 5,266,154 | 11/1993 | Tatsumi | 156/643 |
| 5,286,344 | 2/1994 | Blalock et al. | 156/657 |
| 5,296,095 | 3/1994 | Nabeshima et al. | 156/662 |
| 5,302,236 | 4/1994 | Tahara et al. | 156/643 |
| 5,306,671 | 4/1994 | Ogawa et al. | 437/225 |
| 5,310,454 | 5/1994 | Ohiwa et al. | 156/643 |
| 5,312,518 | 5/1994 | Kadomura | 156/662 |
| 5,312,717 | 5/1994 | Sachdev et al. | 430/313 |
| 5,348,619 | 9/1994 | Bohannon et al. | 156/664 |
| 5,356,515 | 10/1994 | Tahara et al. | 156/643 |
| 5,360,510 | 11/1994 | Kadomura | 156/665 |
| 5,362,361 | 11/1994 | Tatsumi | 156/665 |
| 5,366,590 | 11/1994 | Kadomura | 156/662 |
| 5,369,061 | 11/1994 | Nagayama | 437/228 |
| 5,376,228 | 12/1994 | Yanagida | 156/651 |
| 5,376,234 | 12/1994 | Yanagida | 156/662 |
| 5,378,311 | 1/1995 | Nagayama et al. | 156/643 |
| 5,378,312 | 1/1995 | Gifford et al. | 156/643 |
| 5,388,328 | 2/1995 | Yokono et AL. | 29/852 |
| 5,391,244 | 2/1995 | Kadomura | 156/662 |
| 5,397,431 | 3/1995 | Kadumura | 156/662 |
| 5,401,359 | 3/1995 | Blalock | 204/176 |
| 5,429,710 | 7/1995 | Akiba et al. | 216/17 |
| 5,437,765 | 8/1995 | Loewenstein | 216/51 |
| 5,445,709 | 8/1995 | Kojima et al. | 216/71 |
| 5,445,710 | 8/1995 | Hori et al. | 156/643.1 |
| 5,445,712 | 8/1995 | Yanagida | 156/662 |
| 5,451,543 | 9/1995 | Woo et al. | 437/195 |
| 5,462,892 | 10/1995 | Gabriel | 437/189 |
| 5,468,339 | 11/1995 | Gupta et al. | 216/67 |
| 5,503,901 | 4/1996 | Sakai et al. | 428/161 |
| 5,527,566 | 6/1996 | Schadt et al. | 427/536 |
| 5,534,462 | 7/1996 | Fiordalice et al. | 437/190 |
| 5,540,812 | 7/1996 | Kadomura | 156/652.1 |

OTHER PUBLICATIONS

Ono, Tetsuo. "Mechanism for CF Polymer Film Deposition through Deep SiO2 Holes in Electron Cyclotron Resonance Plasma". Jpn. J. Appl. Phys. vol. 35 (1996) pp. 2465–2471, Part 1, No. 4B, Apr. 1996.

Givens, J., et al. "Selective Dry Etching in a High Density Plasma for 0.5 $\mu$m Complementary Metal–Pxide–Semiconductor Technology". ©American Vacuum Society. J. Vac. Sci. Technol. B 12(1), Jan/Feb 1994.

(List continued on next page.)

Primary Examiner—Mark Chapman
Attorney, Agent, or Firm—W. Eric Webostad

[57] ABSTRACT

Processes for forming pedestal holes in a substrate assembly are described. In particular, processes using a high density plasma to etch doped or undoped silicon oxide are described. For example, a fluorocarbon chemistry is employed for selective deposition of a spacer layer to form a vertical to less than vertical spacer within a contact hole. The contact hole is extended using the spacer and a subsequent etch to complete formation of a via. Alternatively, both spacer deposition and contact hole formation may be achieved in a single etch step.

47 Claims, 12 Drawing Sheets

OTHER PUBLICATIONS

Hutton, Robert S., et al. "Application of Plasmask® Resist and the Desire Process to Lithography at 248 nm", ©American Vacuum Society. 1990.

Thackeray, James W., et al. "Silylated Acid Hardened Resis [SAHR]Technology: Positive, Dry Developable Deep UV Resists", SPIE vol. 1185. *Dry Processing for Submicrometer Lithography* (1989).

"Proceedings of the Symposia on Patterning Science and Technology II" and Proceedings of the Symposia on Interconnection and Contact Metallization for ULSI. Dielectric Science and Technology and Electronics Division, Proceedings vol. 92–6. The Electrochemical Society. Inc.

Dijkstra, J. "Oxygen Plasma Etching of Silylated Resist in a Top–Imaging Lithographic Process". SPIE vol. 1466. Advances in Resist Technology and Processing VIII (1991).

METHOD FOR FORMING A HOLE IN A SEMICONDUCTOR DEVICE

TECHNICAL FIELD OF THE INVENTION

The present invention relates generally to hole formation, and more particularly relates to forming one or more pedestal contact holes in a substrate assembly.

BACKGROUND OF THE INVENTION

Substrate assemblies typically include a substrate member having one or more patterned layers formed therein and thereon. A substrate member is often a semiconductor wafer, such as a slice of monocrystalline silicon. Layers may be grown, deposited, implanted, and in like ways formed.

As technology pushes forward, microlithography continues to resolve smaller and smaller images for patterning layers. Often it is necessary to create a an opening or "via" to access a feature below one or more layers of material. The ability to access such a feature may be severely limited by density of features in an area. So, even though sufficient area may be available for creating a via in an upper layer, such availability may not exist at or near a subsurface contact area. In particular, it would be desirable to provide access for an ohmic contact by virtue of creating a via for filling with an electrically conductive material.

One suggestion proposed by others for providing a via is to form a contact pedestal. In forming such a contact pedestal, the substrate assembly is etched to a first depth. After the etch step, a spacer layer is deposited over etched surfaces (including sidewalls). The spacer layer may be a polycrystalline silicon. The spacer layer is then anisotropically etched to form sidewall spacers within the contact opening. The contact opening is then etched again to increase the depth for via formation. The contact is then filled with an electrically conductive material, leaving the spacer in place.

It would, however, be desirable to provide a contact pedestal with fewer steps, and where the spacer was easily removed for substitution with a more conductive material.

In dry etching oxide, there are various chemistries which may be employed. Some chemistries cause a build-up of polymer. Specifically, in fluorocarbon oxide etch chemistries, a polymer by-product is generated during the etch process. Typically, this is a fluorocarbon polymer. Such fluorocarbon chemistries are known. However, in the past, it was difficult to obtain high anisotropy with fluorine chemistries for high aspect ratios and small critical dimensions.

Consequently, it would be desirable to provide better anisotropic control for small critical dimensions.

SUMMARY OF THE INVENTION

The present invention provides processes for forming one or more holes in a substrate assembly. A first hole is formed which is defined at least in part by a sidewall and a base. The first hole has a first width. It should be understood that the first width may be the diameter of a circle, but it need not be so. Other shapes including ovals may be used. Thus, a width, as used herein, may be a width of a circle, an oval, or other suitable shape for forming a contact hole. A spacer layer is formed along the sidewall, which narrows the width of the first hole. A second hole is then formed extending in a downward direction from the base of the first hole. Because the spacer layer narrows the width of the first hole, the second hole has a second width which is smaller than the first width. After the spacer is removed, a pedestal contact hole is formed. By pedestal, it is meant a hole is defined by a step or step-like feature along its sidewall or sidewalls. Furthermore, the term pedestal, as used herein, is also meant to include a self-aligned hole, namely, a hole defined by a top or starting width opening being substantially larger than a bottom or ending width opening owing to ostensibly continuous tapering.

The present invention provides several methods for forming pedestal holes. Any chemistry employed has ingress and egress through at least a top opening of such a hole. The present invention is particularly well suited for forming vias in this geometry of limited ingress and egress. In one method, a hole is formed, for example, by an etch step. Next, a spacer layer is formed in the hole. The spacer layer may be formed by deposition. Next an anisotropic etch step is used to remove the spacer layer from horizontal surfaces. Notably, etching surfaces may be limited by etch angle. Next, the hole is extended in depth at a location where the spacer layer has been removed. This subsequent extension is formed by an etch step. Such process forms a pedestal via.

In an alternate embodiment, a spacer layer is selectively deposited along sidewalls of a hole. Then an etch for an extension of the hole may proceed. Still in another alternate embodiment, a first etch step is employed to deposit a sidewall spacer as well as form a hole. A subsequent etch step is then employed to extend the hole. In still another embodiment, one etch step is employed for forming both a contact hole as well as a spacer. This is done contemporaneously as explained elsewhere herein.

The present invention is particularly directed to fluorocarbon chemistries. Fluorocarbon chemistry may be employed for creating contact holes in doped or undoped silicon oxide. Silicon oxide may comprise one or more layers. In particular, the present invention is directed at high-density plasma conditions. Such high-density plasma chemistries allow for reliable control of fluorocarbon etches. This allows for greater control for anisotropic profile forming. Moreover, the spacer formed with the fluorocarbon chemistry is a carbon-based spacer. This type of polymer is easily removed by a plasma etch with an oxygen (ASH) step. This allows for material to be placed in a contact via which has a higher conductivity than removed spacer material.

The present invention, by providing self-aligned contact hole formation and anisotropic control, allows for smaller critical dimensions to be formed in a substrate assembly, namely, dimensions smaller than those capable of being printed by the lithography tool used. This is particularly important with the current direction of semiconductor manufacturing going to smaller microlithographies. The present invention is particularly well-suited for making contact to a small contact area constrained by bordering topography and having one or more layers deposited thereon, especially contacts for high-density, substrate assemblies (i.e., a large number of devices in a small area) including but not limited to dynamic random access memory arrays (DRAM arrays).

While the present invention is described in terms of forming a single via, it will be appreciated by those of ordinary skill in the art that multiple vias may be formed simultaneously. Consequently, pluralities of holes and spacers may be simultaneously formed.

Other features and embodiments of the present invention are described or are apparent from reading the detailed description or by practicing the present invention.

BRIEF DESCRIPTION OF THE DRAWINGS

The features of the present invention, as well as objects and advantages, will best be understood by reference to the appended claims, detailed description of particular embodiments and accompanying drawings where:

Figure 1:
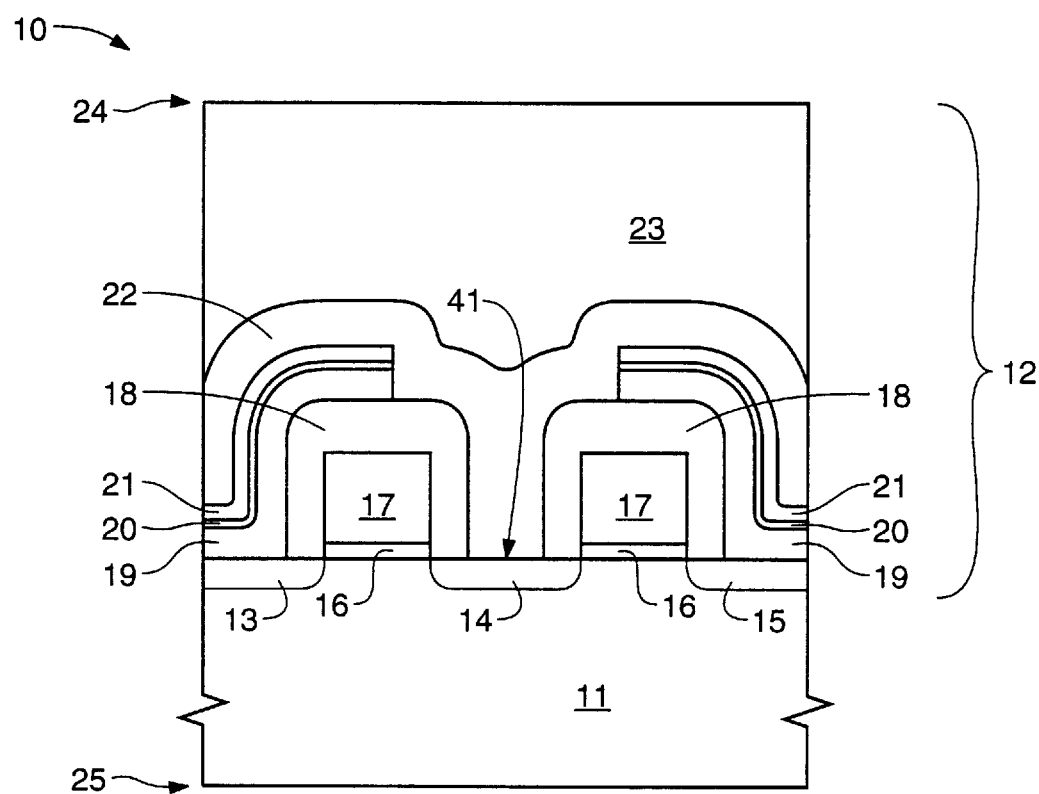
FIG. 1 is a cross-sectional view of a substrate assembly of a dynamic random access memory (DRAM) of the prior art.

Reference numbers refer to the same or equivalent parts of the present invention throughout the several figures of the drawing.

DETAILED DESCRIPTION OF THE PREFERRED EMBODIMENT(S)

Referring to FIG. 1, there is shown a cross-sectional view of substrate assembly 10. Substrate assembly 10 includes top surface 24 and bottom surface 25. Between those two surfaces are included substrate platform member 11 and layers 12. Conventionally, member 11 is monocrystalline silicon. Layers 12, for example, may form transistors, capacitors, resistors, contacts, diodes, inductors, and other well-known elements. For example, doped regions, 13, 14, 15 in combination with insulating layers 16 and gate 17 may form a transistor. These transistors may be insulated by layer 18. Layer 18 may be an oxide layer. Built upon layer 18 may be a portion of a stacked capacitor, in which case conductive layer 19, dielectric layer 20, and conductive layer 21, respectively form bottom plate, dielectric layer, and top plate of capacitors. Insulative layer 22 may be deposited over layers 21, 18, and doped region 14. Insulative layer 22 may also be an oxide layer. A protective layer 23 may be formed over layer 22. Layer 23 may be one or more phosphosilicate glass or borophosphosilicate glass (PSG or BPSG) layers. This is just one example of integrated circuitry. This example typically would be found in a dynamic random access memory (DRAM) array. In the case of a DRAM, a contact via or hole would typically be created from top surface 24 down to doped region 14, in which case layers 23 and 22 would be etched through to make such a contact hole. Once the hole is created, conductive material is formed or deposited in the via. However, noticeably there is more room available for creating a via in layer 23 than in layer 22. An overly wide contact in layer 22 may damage layer 18 and possibly one or more of the transistors protected by layer 18. Therefore, it would be desirable to form a narrow contact through layer 22 to doped region 14. Unfortunately, having a narrow contact over significant depth is problematic. In other words, the greater the aspect ratio, the more difficult it is to form, as well as fill, a contact via. Moreover, a very narrow contact via, once filled, may not meet requirements with respect to speed and resistance.

Therefore, it should be understood that substrate assembly 10 includes one or more layers, which are formed on a substrate platform member 11.

Figure 2:
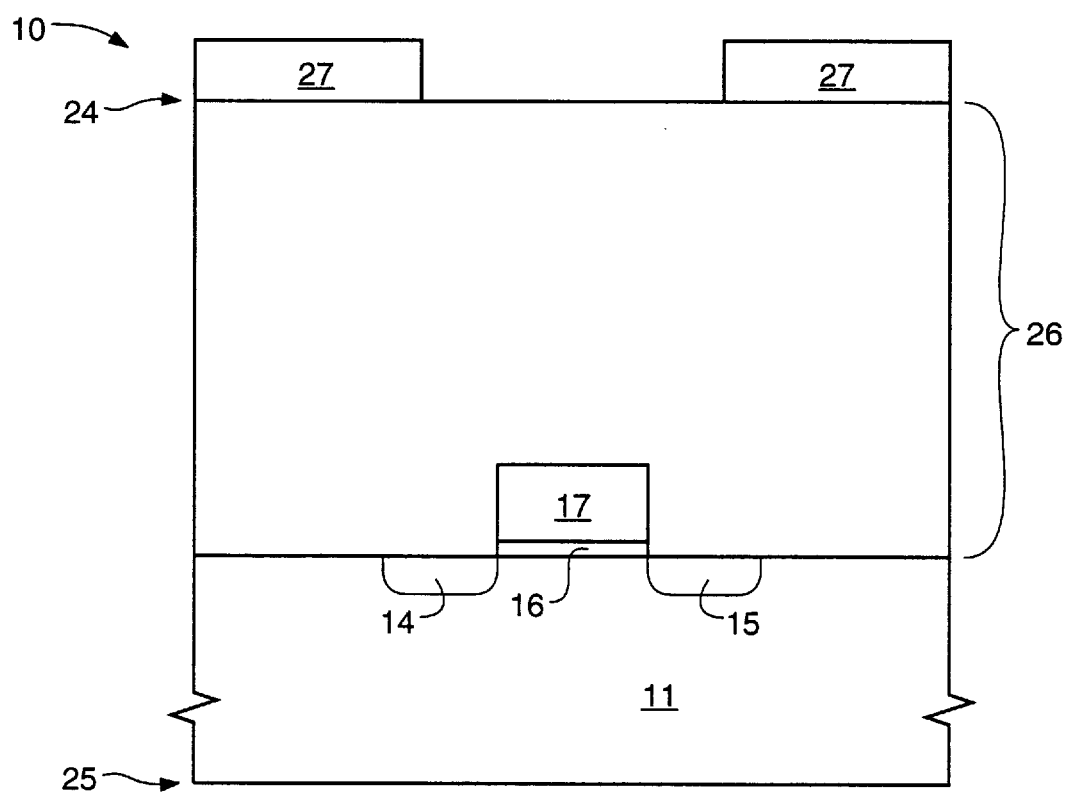
FIG. 2 is a cross-sectional view of a semiconductor substrate having a transistor of the prior art.

Referring to FIG. 2, there is shown a cross-sectional view of substrate assembly 10. Substrate assembly 10 includes one or more layer(s) 26 formed on substrate platform member 11. Moreover, substrate assembly 10 includes at least one microelectronic element in which contact from top surface 24 of layer(s) 26 to such element is to be made. For purposes of illustration, the transistor formed by doped regions 14, 15, insulative layer 16 and conductive layer 17 is shown. Formed on top surface 24 is mask layer 27. Layer 27 may be formed in any of a variety of well-known manners, including deposition of a resist. Such resist may be a photoresist; however, such resist may be reactive with spectral frequencies outside of the light spectrum. For example, a resist, sensitive to a deep ultra violet (DUV) source may be used. In particular, a resist, positive or negative, such as a polymer resin, including but not limited to novolak resin, may be used. Layer 27 may also be a hard mask, such as a nitride or silicon, such as polycrystalline silicon.

Figure 3:
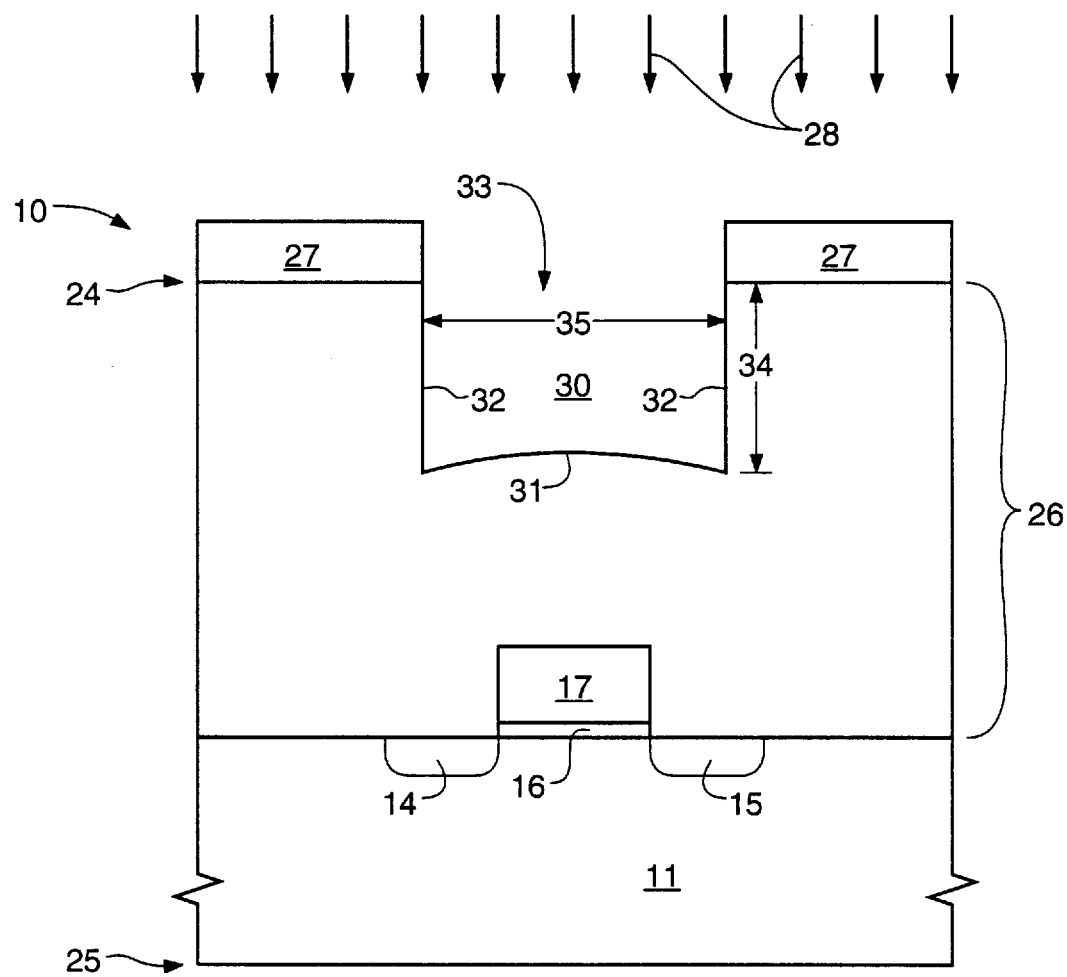
FIG. 3 is the cross-sectional view of FIG. 2 having a first hole formed in a portion of the substrate assembly in accordance with the present invention.

Referring to FIG. 3, there is shown a cross-sectional view of substrate assembly 10 having a first hole 30 formed therein in accordance with the present invention. Hole 30 may be formed by etch step 28. The term hole as used herein includes going through one or more layers, as well as stopping short of going through a top, an intermediate, or a bottom layer. The present invention may be practiced in situ. By in situ, it is meant that method and structure of the present invention may be formed in one chamber without removal of substrate assembly 10. For example, substrate assembly 10 may be inserted into an etch chamber for etch step 28 and not removed from that chamber until completion of via formation in accordance with the present invention. However, multiple chambers may be used in accordance with the present invention if desired. Moreover, it should be understood that the present invention may be practiced within one vacuum system. By one vacuum system, it is meant that vacuum need not be broken between one or more chambers from etch step 28 to via formation in accordance with the present invention.

Figure 15:
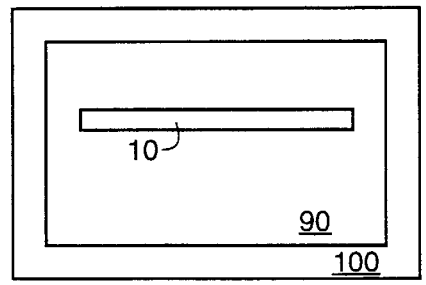
FIG. 15 is a block diagram of a vacuum system in accordance with the present invention.

In particular, substrate assembly 10 is placed in a high-density plasma etch reactor 90 (shown in FIG. 15). Such a reactor may have two plasma sources. One source is for etching layer(s) 26 and the other source is for depositing a polymer, as explained in more detail elsewhere herein. Such a reactor is a low pressure reactor. By low pressure, it is meant that it is operated at or below 50 millitorr. An advantage of low pressure is avoidance of microscopic loading (features of the same size etch more slowly in dense patterns than in sparse patterns). Moreover, such a reactor has separate controls for top and bottom power. The top power is for energizing high-density plasma sources, and the bottom (bias) source is for directing the plasma for etching and for directing the polymer for depositing. Such high-density plasma etchers include a LAM 9100 (TCP (Transformer Coupled Plasma) etcher and an Applied Materials HDP 5300. By high-density plasma, it is meant a plasma having an ion density of greater than $1\times10^{10}$ per cm$^3$ in a plasma generation zone. Typically, high-density plasmas range in ion density from $10^{11}$ to $10^{13}$ per cm$^3$.

Hole 30 is formed by etch step 28. Etch step 28 may be formed by a high-density plasma etch, electron cyclotron resonance (ECR), reactive ion etch (RIE), or other known method of dry etching. However, preferably etch step 28 is done in a high-density plasma reactor for subsequent in situ processing. Etch step 28 may be an anisotropic etch for forming sidewall profile (sidewall) 32. Sidewall 32 may be vertical as illustratively shown; however, vertical sidewalls are not required, as explained in more detail elsewhere herein. By anisotropic, it is meant that etching behavior is not the same in all directions. Aside from sidewall 32, hole 30 includes base profile (base) 31 and opening 33. Opening 33 is along top surface 24 and has a width 35. Hole 30 has a depth 34. It is the ratio of depth 34 to width 35 which defines aspect ratio. Base 31, as illustratively shown, may be bowed ("cusped" or "dovetailed") as illustratively shown.

For mask layer 27, formed with microlithography, it will be appreciated that the present invention facilitates creation of features smaller than the resolution capability of the resist, as well as the resolution capability of the lithography used. In other words, a small dimension may be formed with a larger dimension lithography. The present invention may be used with submicron lithography (i.e., devices with feature sizes less than 1.0 μm, and, in particular, the present invention may be used with 0.35 μm and smaller lithography. Moreover, mask layer 27 may be silylated (have Si added into the resist) to reduce erosion of layer 27.

Figure 4:
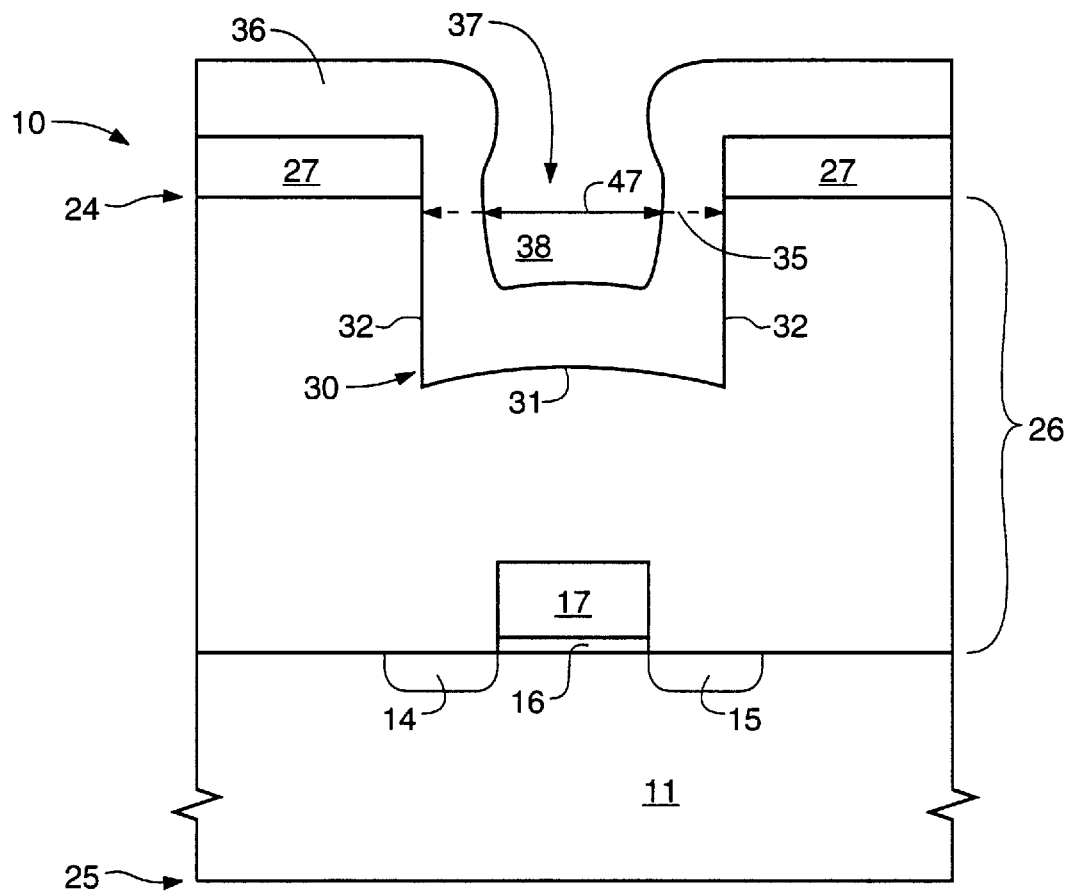
FIG. 4 is the cross-sectional view of FIG. 3 having a spacer layer formed thereon in accordance with the present invention.

Referring to FIG. 4, there is shown a cross-sectional view of substrate assembly 10 having formed thereon layer 36 in accordance with the present invention. As indicated, layer 36 is formed along top of surface 24, as well as sidewall 32 and base 31. Layer 36 may be deposited in situ with respect to etch step 28. Layer 36 may be formed by a plasma enhanced deposition process or chemical vapor deposition (CVD) process. However, preferably layer 36 is formed in a high-density plasma reactor for subsequent in situ processing. Layer 36 is a polymer in accordance with the present invention. Layer 36 acts as a protective or passivation layer with respect to an etching subsequently employed in accordance with the present invention. Notably, width 35 of opening 33 is larger than width 47 of opening 37 within volume 38. In other words, opening 37 is smaller than the lithography employed to create opening 33. Also, it should be appreciated that volume 38 is located within hole 30, and that layer 36 along sidewalls 32 of hole 30 defines narrow tunnel region 72 (shown in FIG. 5), such region being narrower in width (diameter) than width of hole 30.

Figure 5:
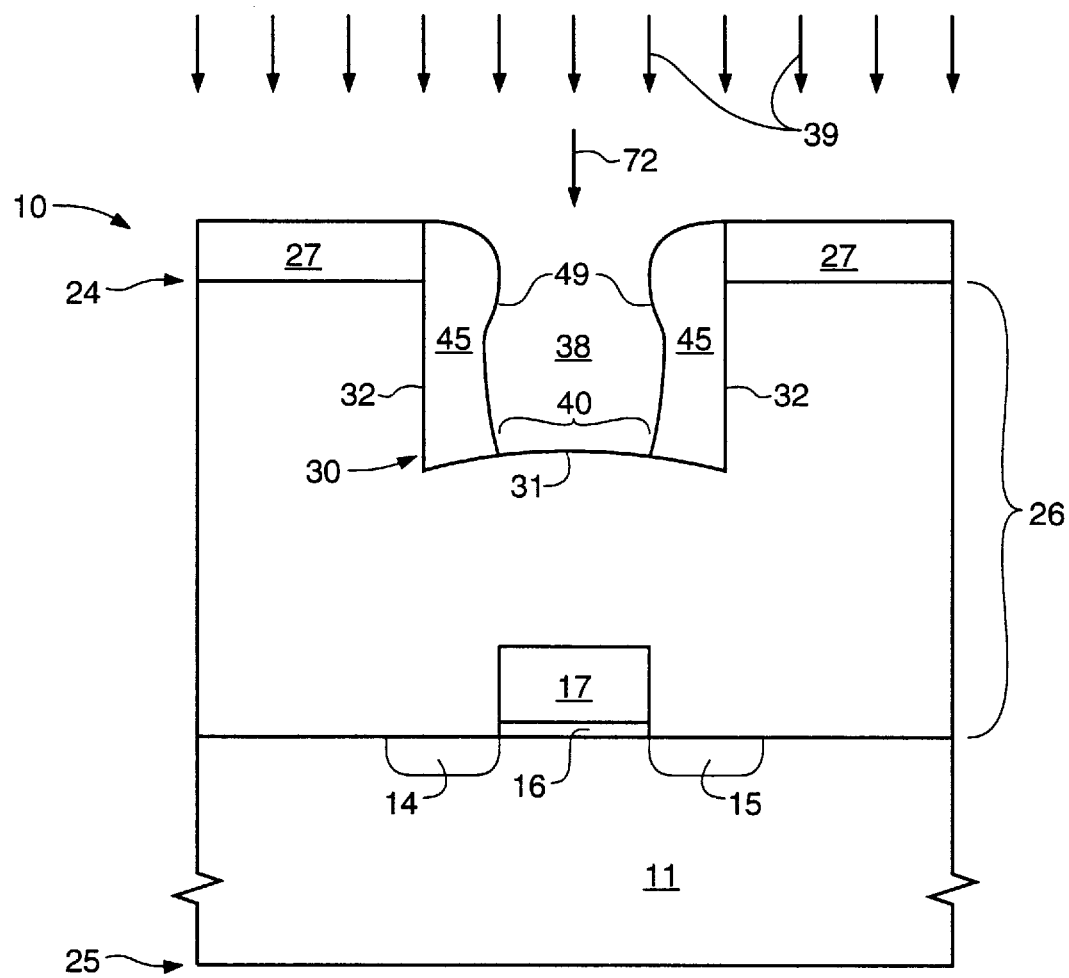
FIG. 5 is the cross-sectional view of FIG. 4 having a portion of the spacer layer removed in accordance with the present invention.

Referring now to FIG. 5, there is shown a cross-sectional view of substrate assembly 10 having a portion of layer 36 removed in accordance with the present invention. Layer 36 may be removed with etch step 39. For layer 36 a carbon based polymer, an oxygen (O$_2$) plasma etch (ASH) may be used. Preferably, layer 36 is removed by an anisotropic etch to form spacer 45. Spacer 45 is thus self-aligned within hole 30. Etch step 39 exposes top surface 24 and portion (region) 40 of base 31, namely that portion of base 31 which borders an expanded volume 38. Etch step 39 may remove some of the polymer of profile 49 of spacer 45. Notably, etch step 39 may be done in situ with respect to etch step 28. Notably, while layer 36 is shown to be completely removed, it need not be so. Rather, only portion 40 of base 31 need be exposed.

Preferably, layer 36 is not deposited as shown in FIG. 4. Rather, layer 36 may be selectively deposited to form spacer 45 along sidewall (profile) 32 and along base 31, except not along portion 40 of base 31. In this manner, layer 36 is not deposited along top surface 24 and portion 40 of base 31. Consequently, etch step 39 may be avoided.

Figure 6:
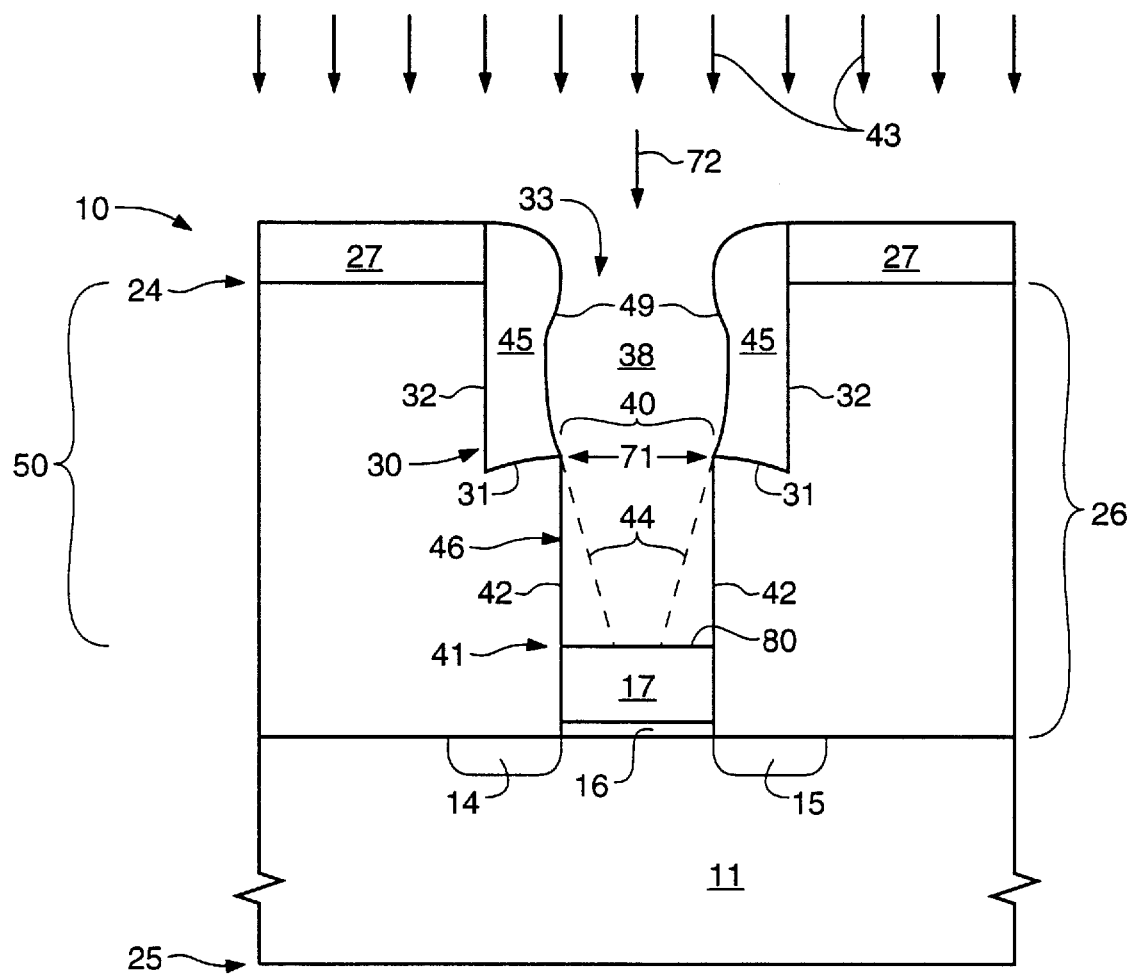
FIG. 6 is the cross-sectional view of FIG. 5 having a second hole formed in a portion of the substrate assembly for forming a pedestal contact via in accordance with the present invention.

Referring now to FIG. 6, there is shown a cross-sectional view of substrate assembly 10 having etched therein via 50 in accordance with the present invention. A lower portion of via 50 is formed by etch step 43. Etch step 43 increases volume 38 below base 31 to form bottom hole portion or extension 46 of hole 30. In other words, second hole 46 is formed extending downward from base 31 of first hole 30. Via 50 is formed by hole 30 (hereinafter top hole portion 30) contiguous with extension 46. Extension 46 has a width 71, which may correspond to region 40 width. Extension 46 may be defined by tapered sidewall 44 or vertical sidewall 42. In either event, width 71 of bottom portion 46 extends narrow tunnel region 72. Via 50 may be formed to make contact with a contact surface 41, such as a gate 17 surface of a transistor as shown in the example of FIG. 6. Contact surface 41 may be of a device, such as a transistor gate, a transistor source/drain region, a capacitor node (plate), a resistor terminal, or like ohmic contact region. Moreover, via 50, 70 need not be made completely down to the contact region. By way of example and not limitation, a remaining portion of the contact hole may be implanted, diffused, or otherwise altered to make it conductive. Alternatively, any remaining portion may be removed by a subsequent etch or over etch. Also, owing to narrowing of via 50 by bottom hole portion 46 with respect to top hole portion 30, more room for misalignment to surface 41without harming surrounding topographies is provided. Notably, etch step 43 may be done in situ with respect to etch step 28.

Spacer 45 may now be removed. Spacer 45 may be removed with an etch step 39. For spacer 45 formed as a carbon based polymer, it may be removed by an ASH step. Notably, this etch step 39 may be done in situ with respect to etch step 28.

Mask layer 27 may be removed with etch step 39. Layer 27 may be removed in situ and contemporaneously with respect to etch step 28. In other words, layer 27 may be removed with removal of spacer 45 while within the chamber employed for creating top hole portion 30 without having removed substrate assembly 10 from such chamber. For layer 27 a carbon-based polymerized resist, an oxygen plasma (O$_2$) etch may be used to remove layer 27; alternatively, a different chemistry may be used, especially if mask layer 27 is silylated.

Figure 7:
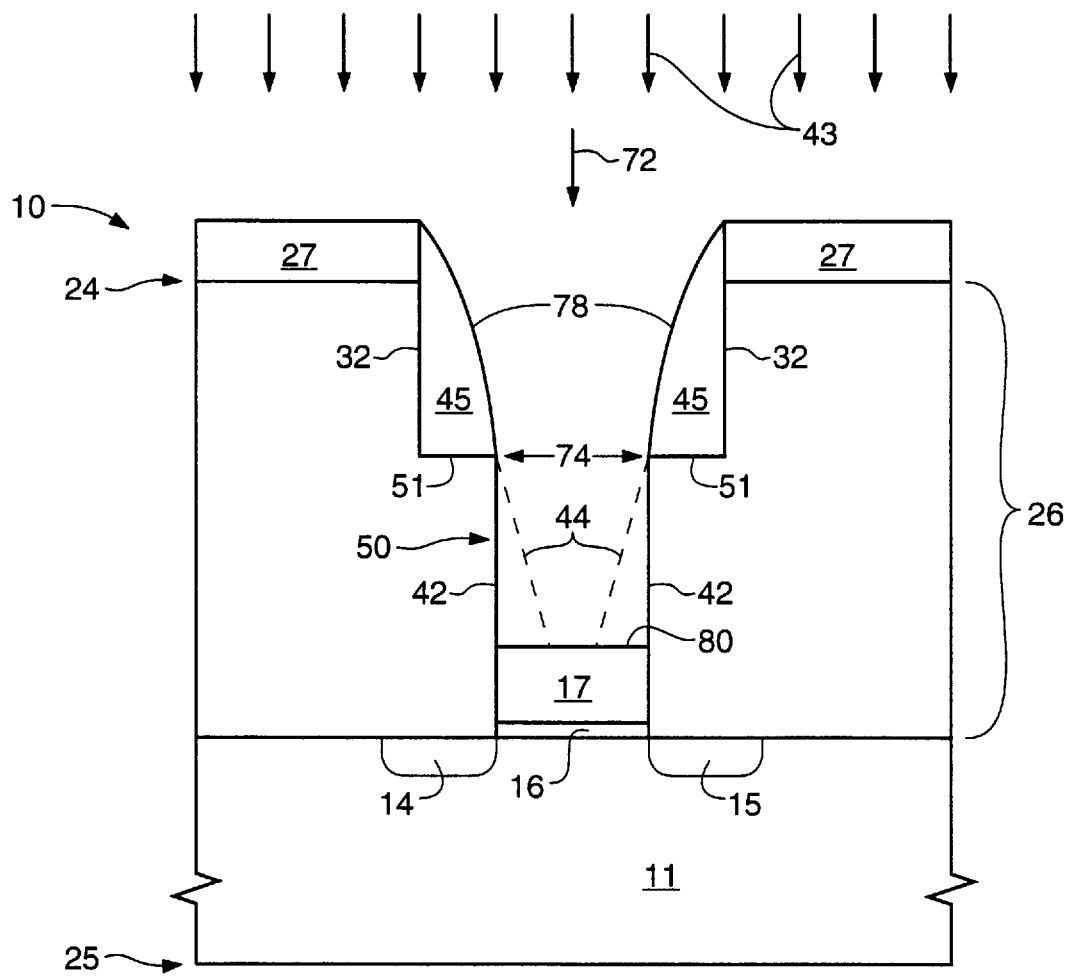
FIGS. 7–10 are cross-sectional views of alternate embodiments of pedestal contact vias formed in accordance with the present invention.
Figure 8:
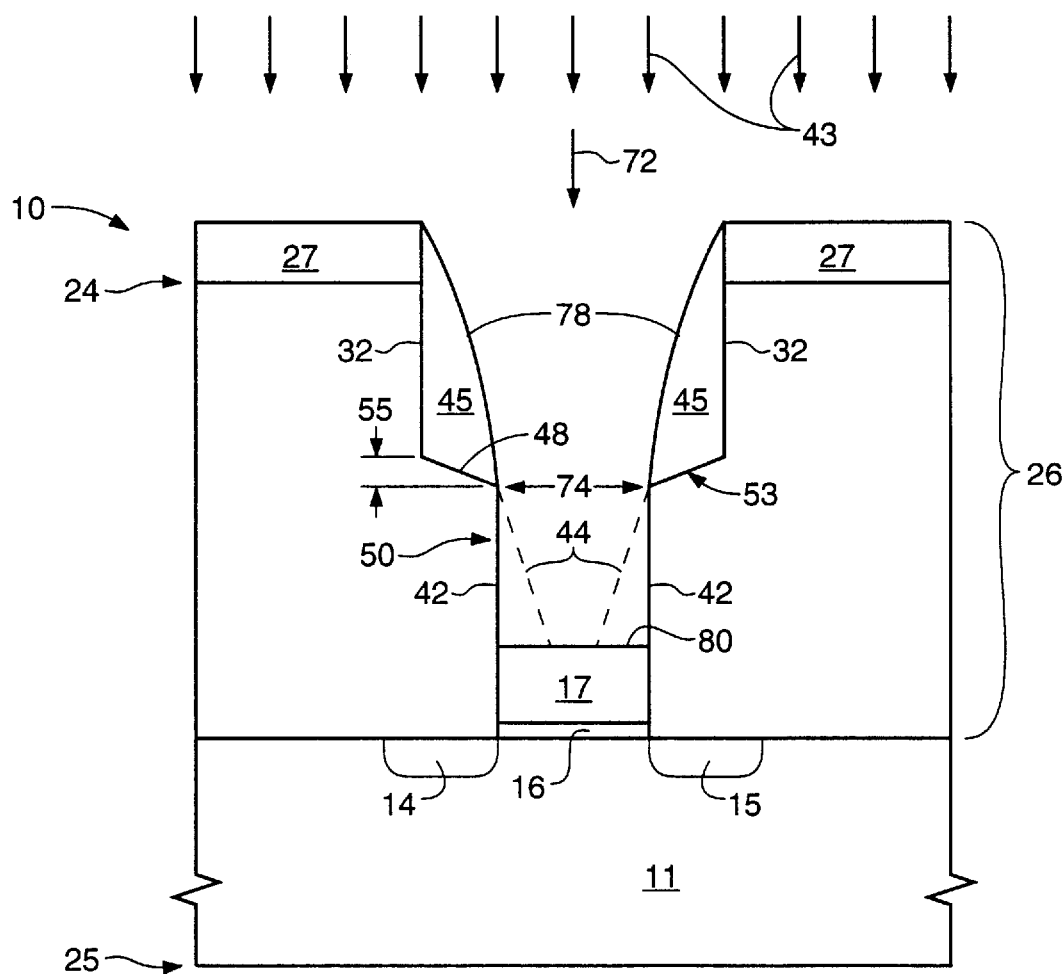
Figure 9:
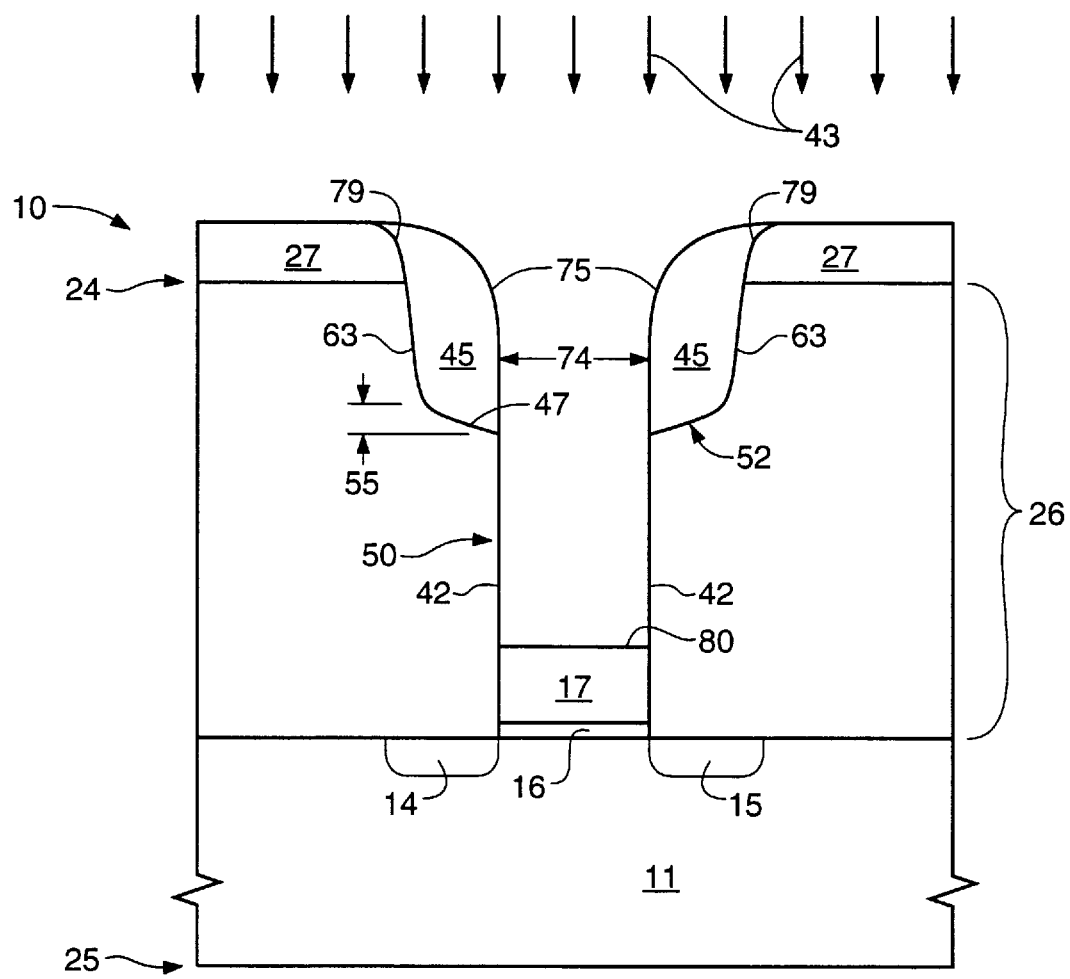
Figure 10:
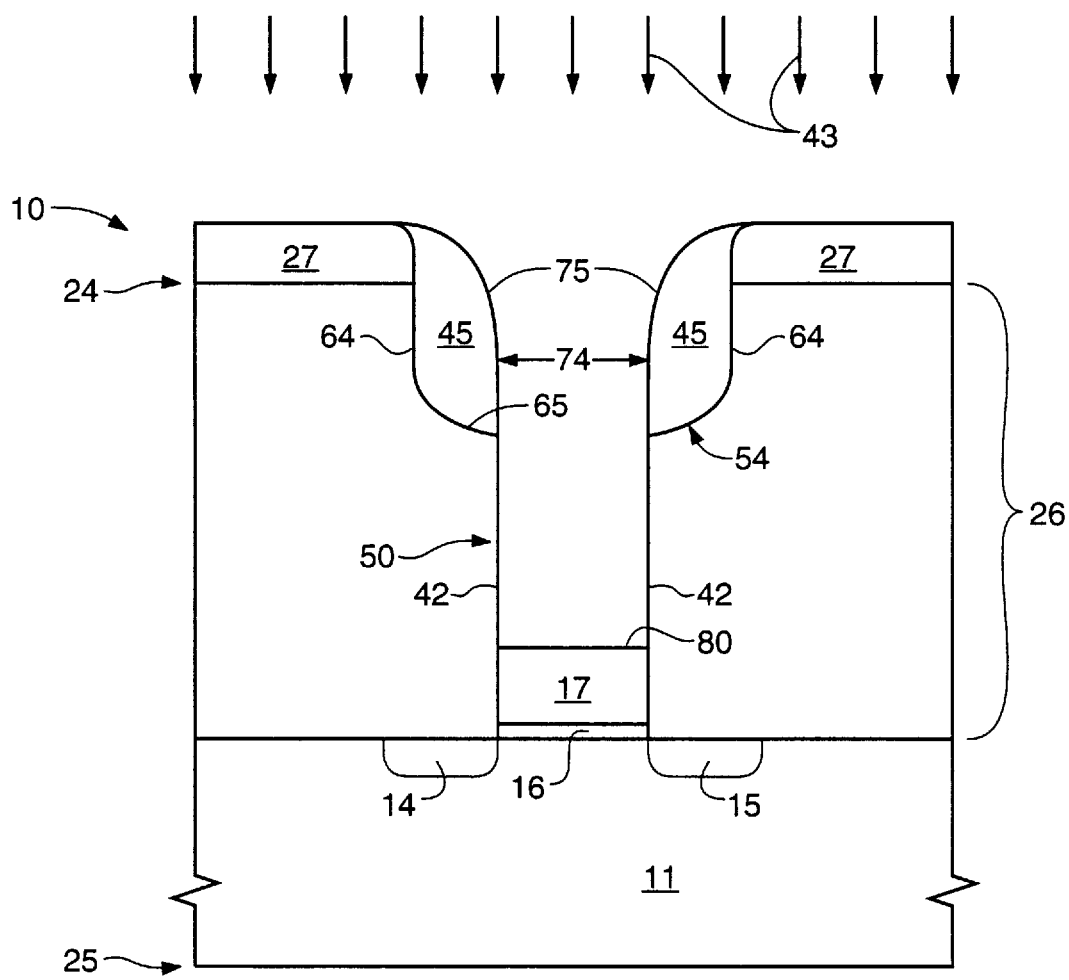

Referring to FIGS. 7–10, there are shown cross-sectional views of substrate assembly 10 having etched therein via 50 with a variety of different profiles in accordance with the present invention. In FIG. 7, spacer 45 has a base 51 with a horizontal profile. The horizontal profile of base 51 avoids the "cusping" or "dovetailing" of base 31 of FIG. 6, for example. Moreover, thickness of layer 27 may affect the degree of taper of tapered profile 78. In FIG. 8, base 53 has a tapered profile 48 forming transition zone 55. In FIG. 9, base 52 has a tapered and curved profile 47 forming transition zone 55. Moreover, sidewall 63 of top hole portion 30 is tapered, and may also be curved as illustratively shown. Also, etching may erode corner 79 of layer 27. Consequently, sylilation of layer 27 may reduce such erosion. Moreover, tapering of an etch may be due to layer 27 erosion such that silylation may reduce such tapering. In FIG. 10, base 54 is similar to that of base 52 albeit profile 65 has a steeper slope than profile 57. However, sidewall 64 of top hole portion 30 is curved where it intersects base 54 and top surface 24, and is vertical elsewhere, unlike sidewall 63, which is tapered throughout. Profile or contour 78 does not reach a smallest width 74 for vertical profiling as close to top surface 24 as does contour 75. The slopes of contours 78, 75 differ, and as a result, spacers 45 reach width 74 at different locations. Slopes of contour 78 may be formed such that subsequent etching below top hole portion 30 causes tapered contour 44, rather than vertical contour 42.

Figure 11:
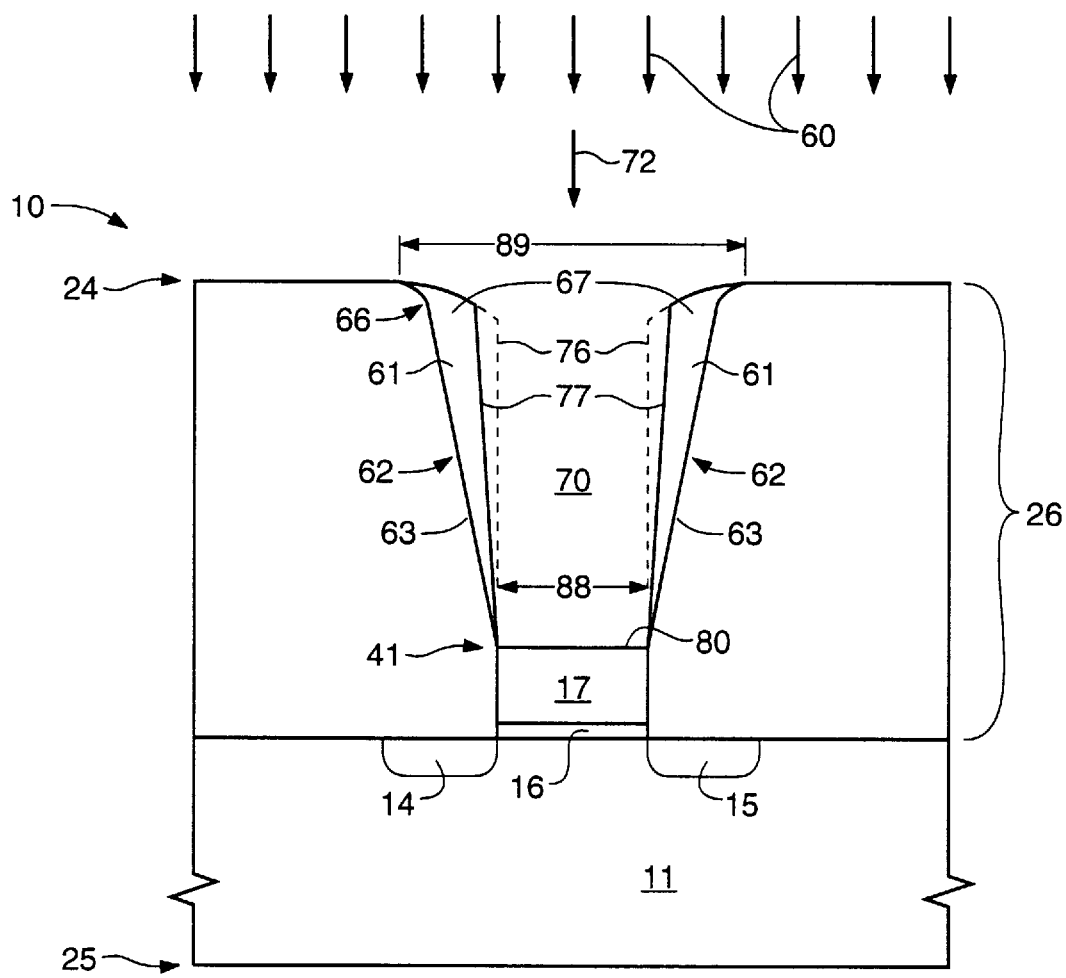
FIG. 11 is a cross-sectional view of an embodiment of a pedestal contact via formed by a single step in accordance with the present invention.

In FIG. 11, there is shown a cross-sectional view of an alternate embodiment of a via 70 formed in accordance with the present invention. Via 70 is formed in a single etch step 60. As hole 66 is formed, polymer 61 forms along sidewall 62 to form spacer 67. Etch step 60 includes both etching of layer 26 as well as deposition of polymer 61 to contemporaneously form hole 66 and spacer 67. Profile 63 is tapered inward owing to passivation by formation of polymer 61 on sidewall 62 with etch step 60. As illustratively shown, contour 77 is tapered; however, a vertical profile 76 may also be provided. Via 70 may be volumetrically increased by removal of spacer 67 by an etch step, as explained elsewhere herein. In which case, via 70 may be equivalent to or slightly larger than hole 66 owing to some etching of layer 26 during removal of polymer 61. Via 50 is for a pedestal contact, whereas via 70 is for a pedestal contact. Top width 89 is substantially wider than bottom width 88 on the order of 2 to 10 times larger.

It should be understood that a top portion or first hole may be formed in accordance with formation of via 70, prior to introducing a second step of forming a bottom portion or second hole in accordance with formation of via 50, to provide a via 50 in accordance with the present invention.

Figure 12:
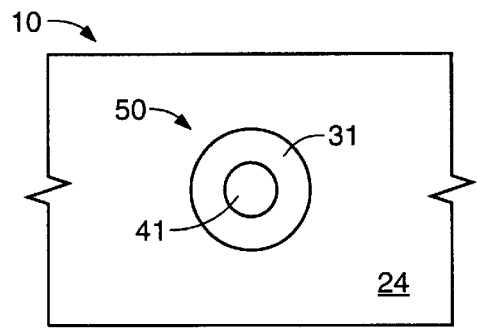
FIGS. 12 and 13 are top elevation views of contact openings in accordance with the present invention.

Referring to FIG. 12, there is shown a top elevation view of an embodiment of via 50 with vertical profiles in accordance with the present invention. From top surface 24, bottom surface 31 and contact surface 41 may be identified.

Figure 13:
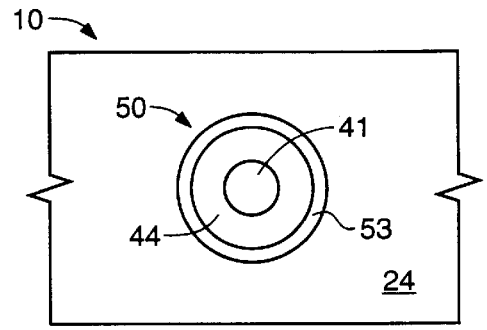

Referring to FIG. 13, there is shown a top elevation view of an embodiment of via 50 with tapered profiles in accordance with the present invention. From top surface 24, base 53, contour 44, and contact surface 41, may be identified. Thus, with reference to FIGS. 12 and 13, it should be understood that vias 50, 70 may be formed with surrounding sidewalls and a closed base such that only a top opening is exposed. This geometry affects etch chemistries and rates.

Figure 14:
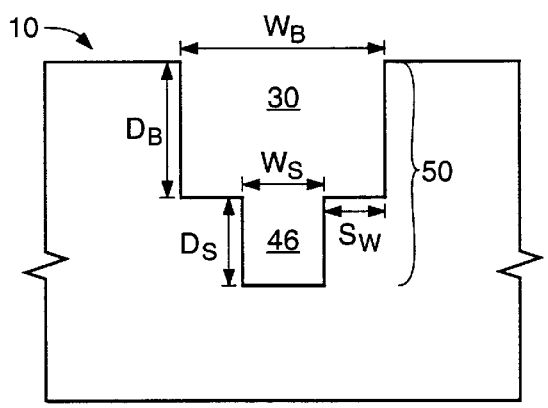
FIG. 14 is a cross-sectional view of a pedestal contact via having width and depth references in accordance with the present invention.

Referring to FIG. 14, there is shown a cross-sectional view of an embodiment of via 50 in accordance with the present invention. Via 50 is made up of portions 30, 46. Top hole portion 30 has width $W_B$ and depth $D_B$. Bottom hole portion 46 has width WS and depth DS. Critical dimensions of $W_B$ and $W_S$ are controlled by a masking layer and a spacer, respectively, as described elsewhere herein. $W_B$ is limited by spacer width, $S_W$, by:

$$2\ S_W < W_B \quad (1)$$
$$\text{WS is limited by spacer width, } S_W, \text{ by:} \quad (2)$$
$$W_B - 2\ S_W = W_S$$
$$\text{For pinch-off,} \quad (3)$$
$$2\ S_W = W_B$$

Hence, WS is independent of $D_B$ or $D_S$, but is dependent on $S_W$.

With reference to FIGS. 3–14, and reference to FIG. 15 where there is shown a block diagram of vacuum system 100 in accordance with the present invention, a detailed description of chemistries of embodiments in accordance with the present invention are described. Substrate assembly 10 is loaded into an etch chamber 90 of system 100. Vacuum system 100 may include one or more chambers 90 connected to one another such that vacuum need not be broken when transferring assembly 10 from one chamber to another. As processing of assembly 10 is preferably performed in situ in a high-density plasma reactor having two plasma sources, further processing of assembly 10 will be described herein using such a reactor.

Assembly 10 has layer 27 already deposited and patterned thereon. Layer 27 in one embodiment is positive-type novolak photoresist patterned by submicron lithography. Prior to a more detailed description of the chemistries involved, it should be appreciated that embodiments of the present invention may be practiced with introduction of a noble gas. Such gases are also often referred to as rare or inert gases. Layer 26 in one embodiment includes one or more films of doped and/or undoped silicon oxide. Such films include but are not limited to PSG, BPSG, TEOS (tetraethylorthosilicate—Si $(OC_2H_5)_4$), Si $O_2$ (silicon dioxide), and the like.

Chamber 90 may be a LAM TCP 9100 having two plasma sources, and top and bottom power sources. Top hole portion 30 may be etched in chamber 90 for a 200 mm (8 inch) silicon wafer as follows:

| | |
|---|---|
| Top Power | 1100 Watts (freq. 13.56 MHz) |
| Bottom Power | 1900 Watts (freq. 4 MHz) |
| Pressure | 5 mT |
| Gas/Rate | $CHF_3$/45 SCCM |
| Gas/Rate | $C_2HF_5$/20 SCCM |
| Time | 55 seconds |
| Wafer Holding Electrode Temp. | 20° C. |
| (SCCM - Standard Cubic Centimeters Per Minute) | |

After top hole portion 30 is formed, polymer layer 36 may be deposited.

In one embodiment, layer 36 is deposited with assembly 10 in chamber 90 and in situ with the prior etch step to create top hole portion 30. For applying layer 36 non-selective to sidewall 32, direct current bias voltage ($V_{DC}$) is held sufficiently low. In this example of polymer deposition, $V_{DC}$ is approximately zero volts. For example,

| | |
|---|---|
| Top Power | 1400 Watts (freq. 13.56 MHz) |
| Bottom Power | 0 Watts |
| Pressure | 5 mT |
| 1. Gas/Rate/Time; or | $C_2F_6$/40 SCCM/110 sec. |
| 2. Gas/Rate/Time; or | $C_2HF_5$/40 SCCM/48 sec. |
| 3. Gas/Rate/Time; or | $C_4F_8$/40 SCCM/35 sec. |
| Wafer Holding Electrode Temp. | 20° C. |

Gas 1, Gas 2, or Gas 3 may be employed for polymer deposition in the above example. In which example, a subsequent ASH step is employed and may be done in situ with the polymer deposition step. For example,

| | |
|---|---|
| Top Power | 300 (freq 13.56 MHz) |
| Bottom Power | 100 (freq 4.0 MHz) |
| Pressure | 5 mT |
| Gas/Rate/Time | $O_2$/50 SCCM/variable from 10 to 20 sec. |
| Wafer Holding Electrode Temp. | 20° C. |

In the next example of polymer deposition, $V_{DC}$ is increased in magnitude to tailor deposition of polymer along sidewalls. In this example, $V_{DC}$ is approximately negative fifty (−50) volts. This is accomplished by increasing bottom power over the preceding example of polymer deposition.

All values are the same as in the prior polymer deposition process, except that bottom power is adjusted as follows:

| | |
|---|---|
| Gas 1, bottom power | 80 Watts (freq. 4.0 MHz) |
| Gas 2, bottom power | 200 Watts (freq. 4.0 MHz) |
| Gas 3, bottom power | 200 Watts (freq. 4.0 MHz) |

In the next example of polymer deposition, $V_{DC}$ is further increased in magnitude to approximately −100 volts. This lowering is achieved by increasing bottom power over the preceding examples of polymer deposition, and further selectively deposits polymer along sidewalls to avoid an etch step 39 for removal of polymer from base 31. Again, all values are the same as in the preceding examples, except for bottom power which is adjusted as follows:

| | |
|---|---|
| Gas 1, bottom power | 250 Watts (freq. 4.0 MHz) |
| Gas 2, bottom power | 425 Watts (freq. 4.0 MHz) |
| Gas 3, bottom power | 410 Watts (freq. 4.0 MHz) |

In these examples, plasma potential is relatively small (less than 50 volts), so the DC bias ($V_{DC}$) describes voltage drop across the wafer's sheath. In alternate approaches it may be desirable to make the plasma potential relatively large (greater than or equal to 50 volts). In which case, voltage drop across a sheath is the sum of $V_{DC}$ and the plasma potential ($V_p$). In other words, effective DC bias is:

$$|V\text{ effective}|=|V_p|+|V_{DC}|$$

In another embodiment, a complete via etch and polymer deposition is achieved in one step (see FIG. 11). This via formation is achieved by allowing the immediately preceding example to continue until via 70 is completely formed. However, for the embodiment where a complete etch is not achieved in one etch/formation step, bottom hole portion 46, is formed in situ with respect to the polymer deposition step, or etch step 39 to remove polymer from base 31. For this second hole, the same process for creating the first hole may be repeated. Of course, spacer 45 is in place for creation of bottom hole portion 46, and preferably the same chamber 90 is used for in situ processing with a high-density plasma etch.

As $V_{DC}$ is increased in magnitude, less polymer is deposited on surfaces with horizontal components; smaller horizontal components tend to have less polymer build-up. This is likely due to increased sputtering. Surfaces with vertical components retain polymer and have polymer build-up; larger vertical components tend to have the same or more build-up. Gas 1 at about −88 volts $V_{DC}$ tends to go past a deposition regime into more of an etching regime with a tapered profile. Gas 3 is preferred for developing 1500 of sidewall polymer build-up for vertical profile spacer. Tapering of inside spacer profiles is likely due to polymer erosion and sputtering of corners 79.

The present invention may be employed in a variety of devices other than a memory, such devices include but are not limited to application specific integrated circuits, microprocessors, microcontrollers, digital signal processors, and the like. Moreover, such devices may be employed in a variety of systems, such systems include but are not limited to memory modules, network cards, telephones, scanners, facsimile machines, routers, copy machines, displays, printers, calculators, and computers, among others.

The present invention has been particularly shown and described with respect to certain preferred embodiments and features thereof. It should be understood that the sequential nature of providing a gas for both masking and etching of the present invention allows for a reduced number of steps over other methods of the present invention. In all the above-described embodiments, it is not necessary that a bottom portion or extension be centered to a top portion of a hole. Moreover, in all of the above described embodiments, a same chamber may be used for in-situ processing, or a same vacuum system may be used. This allows for a simplified method for processing semiconductor wafers. Also, because a spacer is formed within a top portion of a hole, a bottom portion or extension of the hole will be self-aligned to a spacer within the top portion. It should be readily apparent to those of ordinary skill in the art that various changes and modifications in form and detail may be made without departing from the spirit and scope of the present invention as set forth in the appended claims.

What is claimed is:

1. A method of forming a pedestal-shaped hole in a substrate assembly, comprising:
   forming a first hole portion in the substrate assembly, the first hole portion defined at least in part by a sidewall, the first hole portion having a first width;
   forming a polymer spacer on the sidewall of the first hole portion; and
   forming a second hole portion in the substrate assembly, the second hole portion extending inwardly from the bottom of the first hole portion toward the substrate assembly, the second hole portion having a second width which is defined in at least partial response to the polymer spacer and which is smaller than the first width.

2. The method of claim 1, wherein the first hole portion and the second hole portion are formed by at least one anisotropic dry etch.

3. The method of claim 2, wherein the at least one anisotropic dry etch is done with use of a high-density plasma source.

4. The method of claim 3, wherein the at least one anisotropic dry etch is done with use of a fluorocarbon chemistry.

5. The method of claim 1, wherein all steps are done in situ with respect to one another.

6. The method of claim 1, wherein all steps are done in a high-density plasma reactor.

7. The method of claim 1, wherein all steps are done within one vacuum system.

8. The method of claim 1, wherein the second hole portion formation comprises self-aligning the second hole portion within the first hole portion in response to the polymer spacer.

9. The method of claim 1, further comprising removing the polymer spacer from the sidewall defining the first hole portion.

10. The method of claim 9, further comprising forming at least one conductive material in the first hole portion and the second hole portion.

11. The method of claim 1, wherein the polymer spacer formation comprises selectively depositing the polymer spacer on the sidewall defining the first hole portion.

12. A method of forming a pedestal-shaped hole in a substrate assembly, comprising:
   forming a first hole portion in the substrate assembly, the first hole portion defined at least in part by a sidewall and a base, the first hole portion having an uppermost first opening, the uppermost first opening having a first width;

forming a polymer spacer on at least a portion of the sidewall and base defining the first hole portion;

removing at least part of the polymer spacer to expose at least a part of the base defining the first hole portion; and forming a second hole portion extending downwardly from the bottom of the first hole portion toward the substrate assembly, the second hole portion having an uppermost second opening formed at the base defining the first hole portion, the second opening having a second width which is defined at least partly in response to the polymer spacer and which is less than the first width of the first opening, the first hole portion and the second hole portion in combination providing the pedestal-shaped hole.

13. The method of claim 12, wherein the first hole portion is formed by a first plasma etch, and the second hole portion is formed by a second plasma etch.

14. The method of claim 13, wherein the first plasma etch and the second plasma etch each comprise using a high-density plasma source.

15. The method of claim 14, wherein the first plasma etch and the second plasma etch each comprise using a fluorocarbon chemistry.

16. The method of claim 12, wherein all steps are done in situ with respect to one another.

17. The method of claim 16, wherein all steps are done in a high-density plasma reactor.

18. The method of claim 12, wherein all steps are done within one vacuum system.

19. The method of claim 12, wherein the second hole portion formation comprises self-aligning the second hole portion within the first hole portion.

20. The method of claim 12, further comprising removing the polymer spacer from the sidewall defining the first hole portion.

21. The method of claim 12, further comprising forming at least one conductive material in the first hole portion and the second hole portion.

22. The method of claim 12, wherein the polymer spacer formation comprises depositing a polymer spacer layer over a surface of the substrate assembly.

23. A method of forming a pedestal-shaped hole in a substrate assembly, comprising:

forming a first hole portion in the substrate assembly, the first hole portion defined at least a sidewall and a base, the first hole having a first opening;

forming a polymer spacer on at least a substantial portion of the sidewall defining the first hole portion; and while forming the polymer spacer, forming a second hole portion extending inwardly from the bottom of the first hole portion toward the substrate assembly, the second hole portion having a second opening formed at the base defining the first hole portion, the second opening having a width defined in response to the polymer spacer such that the first opening is larger in width than the second opening, the first hole portion and the second hole portion in combination providing the pedestal-shaped hole.

24. A method of forming a pedestal-shaped hole in a substrate assembly, comprising:

forming a first portion of the pedestal-shaped hole in the substrate assembly, the first portion of the pedestal-shaped hole defined at least in part by a sidewall and a base, the pedestal-shaped hole having a first opening;

forming a polymer spacer on the sidewall defining the first portion of the pedestal-shaped hole; and forming a second portion of the pedestal-shaped hole extending downwardly from the bottom of the first portion of the pedestal-shaped hole toward the substrate assembly, the second portion of the pedestal-shaped hole having a second opening formed at the base defining the first portion of the pedestal-shaped hole, the second opening having a width defined at least in part to the polymer spacer such that the first opening is larger than the second opening.

25. A method of forming a pedestal-shaped hole in a substrate assembly, comprising:

forming a first portion of the pedestal-shaped hole in the substrate assembly, the first portion of the pedestal-shaped hole defined at least in part by a sidewall and a base, the first portion of the pedestal-shaped hole having a first opening;

selectively depositing a polymer spacer on at least a portion of the sidewall defining the first portion of the pedestal-shaped hole; and forming a second portion of the pedestal-shaped hole extending downwardly from the bottom of the first portion of the pedestal-shaped hole toward the substrate assembly, the second portion of the pedestal-shaped hole having a second opening formed at the base defining the first portion of the pedestal-shaped hole, the second opening having a width owing at least in part to the polymer spacer such that the first opening is larger than the second opening.

26. A method of forming a tapered via in a substrate assembly, comprising:

forming a hole in the substrate assembly along a surface thereof, the hole defined at least in part by a sidewall and a base, the hole having an opening; and while forming the hole, forming a polymer spacer on at least a portion of the sidewall defining the hole, the sidewall having a tapered profile which in combination with the polymer spacer progressively limits the opening in an inward direction toward the substrate assembly.

27. The method of claim 26, wherein the hole formation comprises performing an anisotropic dry etch.

28. The method of claim 27, wherein the anisotropic dry etch comprises using a high density plasma source.

29. The method of claim 28, wherein the anisotropic dry etch comprises using a fluorocarbon chemistry.

30. The method of claim 26, wherein all steps are done in situ with respect to one another.

31. The method of claim 30, wherein all steps are done in a high-density plasma reactor.

32. The method of claim 26, wherein all steps are done within one vacuum system.

33. The method of claim 26, wherein the opening is self-aligned within the hole by the polymer spacer.

34. The method of claim 26, further comprising removing the polymer spacer from the sidewall defining the hole.

35. The method of claim 34, further comprising conforming at least one conductive material in the hole.

36. The method of claim 26, wherein the polymer spacer formation comprises selectively depositing a polymer on the sidewall defining the hole.

37. A method of forming a sub-lithographic resolution contact opening in a region of a semiconductor device of a substrate assembly, comprising:

having a reactor chamber;

depositing a mask on said substrate assembly at a lithographic resolution;

etching said substrate assembly in said reactor chamber with said mask to define a recess formed at said lithographic resolution, said recess having a first opening along an upper portion thereof;

forming a polymer spacer within said recess, said polymer spacer formed in situ in said reactor chamber, said spacer defined to expose an area of said region on said substrate assembly, said exposed area being smaller than an area of said recess at said first opening; and etching said substrate assembly in situ in said chamber utilizing said spacer as an etch mask to define said sub-lithographic resolution contact opening.

38. The method of claim 37, wherein said region comprises a dielectric material on said substrate assembly.

39. The method of claim 38, wherein said region comprises a single dielectric layer on said substrate assembly.

40. A method of forming a contact opening in a dielectric of a substrate assembly, comprising:

providing a vacuum system comprising a reactor chamber, said reactor chamber having at least two plasma sources;

forming an etch mask on said substrate assembly, said etch mask at least one defining location for said contact opening in said dielectric;

etching said substrate assembly in said reactor chamber to form at least one recess, said etch performed at a pressure in said reactor chamber no greater than 50 millitorr and with a first source of said plasma sources operated preferentially relative to a second source of said plasma sources;

without breaking vacuum on said substrate assembly, forming a polymer spacer layer within said recess and configuring said polymer spacer layer within said recess to expose an area of said dielectric defining a lower portion of said recess; and without breaking vacuum on said substrate assembly, etching said substrate assembly a second time where said polymer spacer layer is utilized as an etch mask.

41. The method of claim 40, wherein said polymer spacer layer is formed in said reactor chamber.

42. The method of claim 41, wherein said polymer spacer layer is formed in said reactor chamber with said second source operated preferentially to said first source.

43. The method of claim 42, wherein said etch mask openings are defined at a first lithographic resolution, and wherein said polymer spacer layer defines etch mask openings of a second smaller resolution.

44. A method of forming a contact opening in a dielectric layer, comprising:

forming a first opening in said dielectric layer;

forming a polymer spacer layer within said opening, said polymer spacer layer configured to expose a region of said dielectric layer at a lower portion of said opening; and forming a second opening in said dielectric layer utilizing said spacer layer as an etch mask.

45. A method of forming a contact opening in a substrate assembly, comprising:

placing said substrate assembly within an etch chamber;

forming a first opening in said substrate assembly located within said etch chamber;

forming a polymer spacer within said first opening, said polymer spacer formed without exposing said wafer to the atmosphere;

etching a second opening in said substrate assembly utilizing said spacer as an etch mask, said second opening formed without exposing said substrate assembly to the atmosphere, said second opening configured with said first opening.

46. A method of forming a contact opening in a substrate assembly, comprising:

providing a chamber of a high density plasma reactor, said chamber having an upper power source and a lower power source;

placing said substrate assembly within said chamber;

etching a first opening in said substrate assembly in said chamber;

depositing a polymer film within said first opening, said depositing performed within said chamber; and etching a second opening in said substrate assembly within said chamber, said second opening etched using at least a portion of said polymer film as an etch mask.

47. A method for forming a contact via in a substrate assembly, comprising:

providing a chamber of a high-density plasma reactor;

placing and sealing said substrate assembly in said chamber;

without unsealing said chamber to remove said substrate assembly from said chamber, etching a recess in said substrate assembly;

forming an etch mask within said recess; and etching to extend said recess into said substrate assembly utilizing said etch mask.

* * * * *